United States Patent
Dekker et al.

(10) Patent No.: US 6,551,890 B2
(45) Date of Patent: *Apr. 22, 2003

(54) METHOD OF MANUFACTURING A SEMICONDUCTOR DEVICE COMPRISING A BIPOLAR TRANSISTOR AND A CAPACITOR

(75) Inventors: Ronald Dekker, Eindhoven (NL); Petrus H. C. Magnee, Eindhoven (NL)

(73) Assignee: Koninklijke Philips Electronics N.V., Eindhoven (NL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/520,061

(22) Filed: Mar. 7, 2000

(65) Prior Publication Data
US 2002/0086488 A1 Jul. 4, 2002

(30) Foreign Application Priority Data
Mar. 10, 1999 (EP) .............................................. 99200724

(51) Int. Cl.⁷ .......................................... H01L 21/8222
(52) U.S. Cl. ........................................ 438/329; 438/326
(58) Field of Search ................................ 438/309, 322, 438/326, 329, 381

(56) References Cited

U.S. PATENT DOCUMENTS

| | | | | |
|---|---|---|---|---|
| 5,336,632 A | | 8/1994 | Imamura ..................... | 437/60 |
| 5,858,850 A | * | 1/1999 | Gomi ......................... | 438/314 |
| 5,943,564 A | * | 8/1999 | Chen et al. .................. | 438/202 |
| 6,025,219 A | * | 2/2000 | Kinoshita .................... | 438/202 |
| 6,083,805 A | * | 7/2000 | Ouellet et al. ............... | 438/396 |
| 6,204,104 B1 | * | 3/2001 | Fujii .......................... | 438/234 |

* cited by examiner

*Primary Examiner*—John F. Niebling
*Assistant Examiner*—Christopher Lattin
(74) *Attorney, Agent, or Firm*—Aaron Waxler

(57) ABSTRACT

A method of manufacturing a semiconductor device comprising a poly-emitter transistor (1) and a capacitor (2). A base electrode (14), a first electrode (16, 37) and an emitter window (18) are formed at the same time in a first polysilicon layer (13) covered with an insulating layer (25). Subsequently, the side walls of the electrodes (20, 39) and the wall (23) of the emitter window are covered at the same time with insulating spacers (22, 44) by depositing a layer of an insulating material, followed by an anisotropic etching process. The base (8) of the transistor is formed by ion implantation. The emitter (9) is formed by diffusion, from an emitter electrode (30) formed in a second polysilicon layer. Preferably, the first electrode of the capacitor consists of mutually connected strips (37).

7 Claims, 5 Drawing Sheets

METHOD OF MANUFACTURING A SEMICONDUCTOR DEVICE COMPRISING A BIPOLAR TRANSISTOR AND A CAPACITOR

BACKGROUND OF THE INVENTION

The invention relates to a method of manufacturing a semiconductor device comprising a bipolar transistor and a capacitor, wherein a first layer of polycrystalline silicon is deposited on a surface of a semiconductor body, in which first layer of polycrystalline silicon there is formed a first pattern of conductors with a base electrode and a first capacitor electrode, and in which also an emitter window is etched, which is situated within the base electrode, wherein a layer of an insulating material is applied to the upper side and the side faces of the conductors and to the wall of the window, whereafter, in succession, the base region of the transistor in the semiconductor body is formed from an edge of the base electrode adjoining the emitter window, by implantation of ions through the emitter window and by diffusion of a dopant, a second layer of polycrystalline silicon is deposited wherein a second pattern of conductors is formed with an emitter electrode and a second capacitor electrode, and the emitter region of the transistor in the base region is formed from the emitter electrode by diffusion of a dopant.

Such a method enables a semiconductor device comprising a single transistor and a single capacitor to be manufactured as well as an integrated circuit comprising a plurality of these elements. The transistors have a base region and an emitter region which are formed by the emitter window formed in the base electrode. Such transistors, also referred to as polyemitter transistors, can be embodied so as to be very small, and can particularly suitably be used to process signals of very high frequency, such as mobile telephony signals. Since the capacitors are also formed on the surface of the semiconductor body, conductor tracks connecting capacitors to one another and to transistors are very short. By virtue thereof, the method can very suitably be used to manufacture integrated circuits for processing said high-frequency signals.

U.S. Pat. Ser. No. 5,336,632 describes a method of the type mentioned in the opening paragraph, wherein, after deposition of the first layer of polycrystalline silicon, the first pattern of conductors with the base electrode and the first capacitor electrode is formed first in this layer using a first anisotropic etching process. Subsequently, a first, composite layer of an insulating material is deposited on this pattern of conductors, said composite layer consisting of a bottom layer of silicon nitride, an intermediate layer of silicon oxide and a top layer of silicon nitride. Subsequently, by means of a second anisotropic etching process, the emitter window is formed both in the first, composite layer of insulating material and in the first layer of polycrystalline silicon. Next, the wall of the emitter window thus formed is provided with a layer of an insulating material by depositing a second layer of an insulating material and subsequently anisotropically etching this layer until parts thereof extending parallel to the surface have been removed again. Prior to the deposition of the second layer of polycrystalline silicon, a third etching process is carried out at the location of the first capacitor electrode to remove the top layer and the intermediate layer of the first, composite layer of insulating material. In this manner, a capacitor is formed having a relatively thin dielectric between both capacitor electrodes.

To form the pattern of conductors with a base electrode and a first capacitor electrode, and to form the emitter window situated within the base electrode, the known method employs two anisotropic etching processes. The first anisotropic etching process is used to form the pattern of conductors, the second to form the emitter window. To carry out such an etching process, a photoresist mask must be applied twice to the first layer of polycrystalline silicon. The second photoresist mask must be aligned with respect to the base electrode formed by means of the first photoresist mask.

SUMMARY OF THE INVENTION

It is an object of the invention to provide a simpler method. To achieve this, the method described in the opening paragraph is characterized in that after deposition of the first layer of polycrystalline silicon on the surface of the semiconductor body, first of all, a first layer of an insulating material is deposited on this layer, whereafter both the first pattern of conductors and the emitter window are simultaneously etched in both layers, after which the side faces of the conductors and the wall of the emitter window are simultaneously provided with a layer of an insulating material by depositing a second layer of an insulating material and anisotropically etching this layer until parts thereof extending parallel to the surface have been removed again.

The first pattern of conductors and the emitter window are simultaneously etched in the first layer of polycrystalline silicon. This requires only one photoresist mask.

The first pattern of conductors is etched in the first layer of polycrystalline silicon after this first layer has been covered with the first layer of an insulating material. Thus, after etching, the conductors are automatically provided at their upper side with a layer of an insulating material.

After the formation of the first pattern of conductors and the emitter window in the first layer of polycrystalline silicon, the second layer of insulating material is deposited and subsequently anisotropically etched until parts thereof extending parallel to the surface have been removed again. Apart from the wall of the emitter window, the side faces of the conductors are thus automatically provided with a layer of an insulating material.

The first layer of insulating material, which is deposited on the first layer of polycrystalline silicon, can be etched away over a part of its thickness at the location of the first capacitor electrode before the second capacitor electrode is formed. This results in the formation of a capacitor having a relatively thin dielectric. This can alternatively be realized, as in the known method, by depositing a composite layer as the first layer of insulating material, comprising a bottom layer, an intermediate layer and an upper layer, the intermediate and upper layer being removed at the location of the first capacitor electrode. In either case, the formation of a capacitor having a relatively large capacitance requires the deposition of a photoresist mask on the first layer of insulating material. Preferably, however, a larger capacitance is obtained by forming, in accordance with the invention, the second capacitor electrode in such a manner that it covers both the upper side and the side face of the first capacitor electrode. In the method in accordance with the invention, the side faces of the first capacitor electrode and the wall of the emitter window are simultaneously provided with a similar layer of insulating material. This layer is relatively thin. Since the second capacitor electrode extends beyond the side face of the first capacitor electrode, the side face contributes to the size of the capacitance of the capacitor. In this manner, a capacitor having a larger capacitance can be formed without employing an additional photoresist mask, and without this increase in capacitance taking up more space on the surface of the semiconductor body.

The capacitance is increased even further if, in the formation of the first pattern of conductors, a first capacitor electrode is formed which is composed of a number of mutually interconnected strips extending parallel to one another. The side faces of all strips are automatically covered with the second layer of insulating material which, as indicated hereinabove, may be very thin. In this manner a capacitor having a much larger capacitance than a stripless capacitor can be formed on a surface of the same size.

Preferably, for covering the wall of the emitter window and the side faces of the conductors, a third layer of an insulating material is deposited after the deposition of the second layer of insulating material, whereafter the third layer is anisotropically etched until parts thereof extending parallel to the surface are removed again, whereafter, in succession, uncovered parts of the second layer and, finally, the remaining parts of the third layer are removed. In this manner, a very thin insulating layer can be formed on the side face of the first capacitor electrode, so that the contribution of the side face to the capacitance of the capacitor can be even greater.

These and other aspects of the invention will be apparent from and elucidated with reference to the embodiments described hereinafter.

BRIEF DESCRIPTION OF THE DRAWING

In the drawings.

The Figures are diagrammatic and not drawn to scale, and like reference numerals refer to like parts.

DESCRIPTION OF THE PREFERRED EMBODIMENTS

Figure 4:
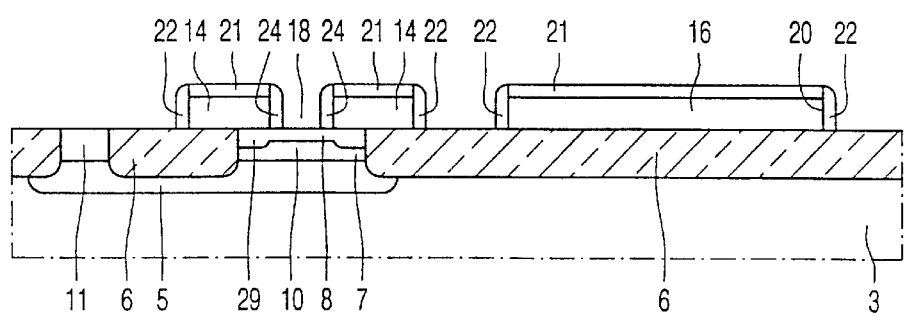
Figure 5:
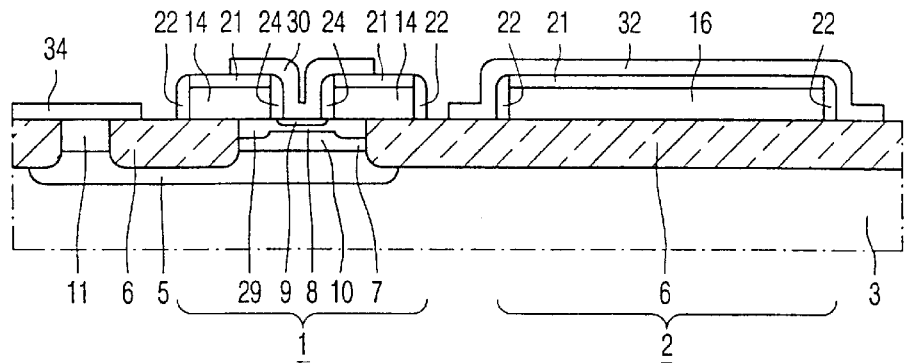
Figure 6:
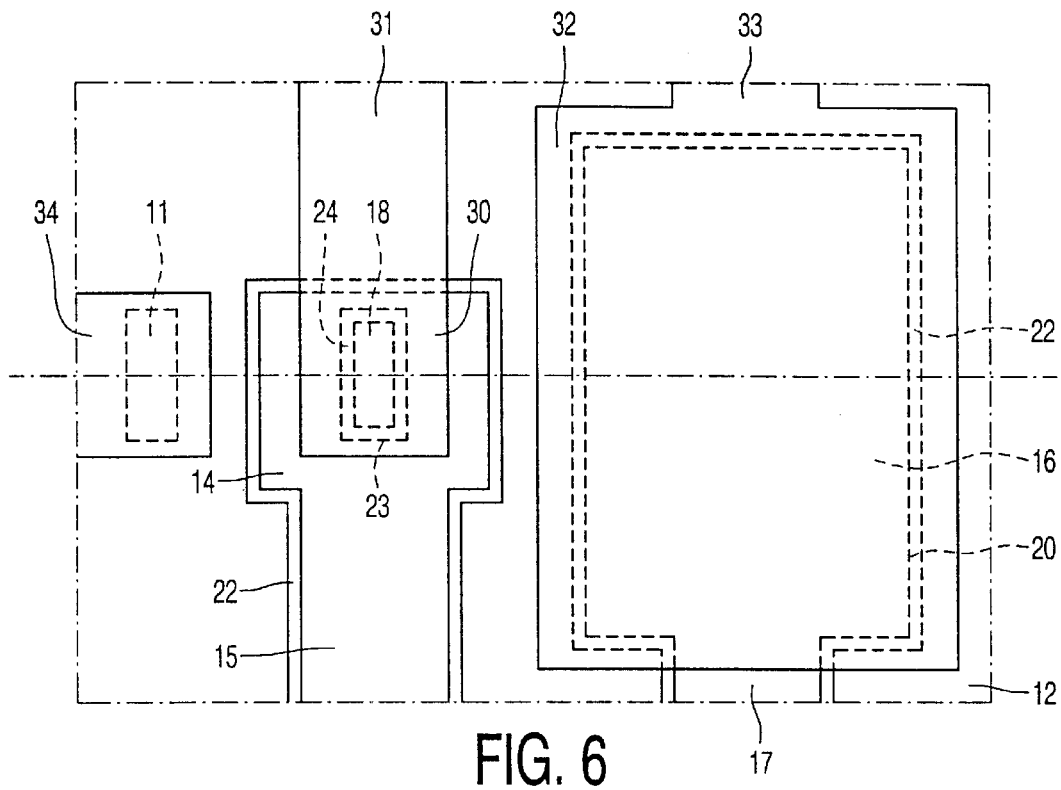
FIG. 6 is a diagrammatic plan view, of several stages in the manufacture of a semiconductor device, using a first embodiment of the method in accordance with the invention.

FIGS. 1 through 5 are cross-sectional views, and FIG. 6 is a plan view, of several stages of a first example of the manufacture of a semiconductor device comprising a bipolar transistor 1 and a capacitor 2. There is started from a semiconductor body, here a slice of silicon 3, which is provided with a p-type light doping of approximately $10^{15}$ boron atoms per cc and which is provided with an epitaxial top layer 4 which is provided with an n-type light doping of approximately $10^{15}$ arsenic atoms per cc, and with a buried layer 5 which is provided with a n-type heavy doping of $10^{19}$ arsenic atoms per cc. In the semiconductor body 1, field oxide 6 is provided in a customary manner. This field oxide 6 envelops an active region 7 wherein a base region 8 and an emitter region 9 of the transistor will be formed. The part of the active region 7 which is directly adjacent to the buried layer 5 forms the collector region 10 of the transistor. The collector region is contacted by the buried layer 5 and a connection region 11 enveloped by field oxide 6.

The field oxide 6, the active region 7 and the connection region 11 are adjacent to a surface 12 of the semiconductor body 1. On this surface 12 there is deposited in a customary manner a first, approximately 500 nm thick layer of polycrystalline silicon 13 which is p-type doped with approximately $10^{20}$ atoms per cc. In this layer 13, a first pattern of conductors 14, 15, 16, 17 is formed with a base electrode 14 and a first capacitor electrode 16. In addition, an emitter window 18 is etched in the layer of polycrystalline silicon, which emitter window is situated within the base electrode 14. In the course of this etching process, the field oxide is locally exposed. This enables end point detection, so that the etching process can be stopped as soon as the field oxide, but also the active region, is exposed.

Figure 1:
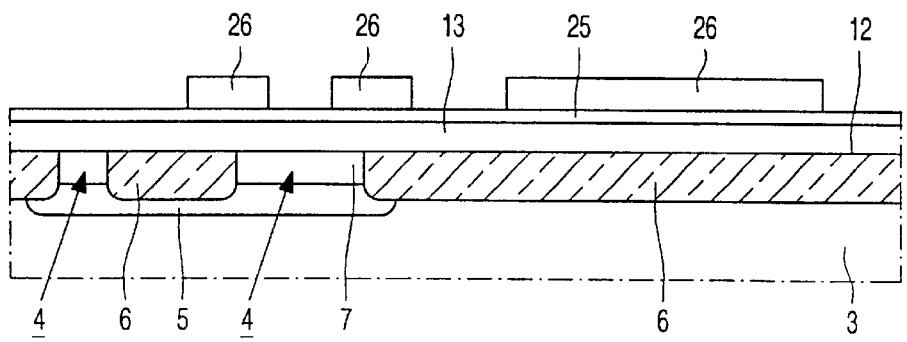
FIGS. 1 through 5 are diagrammatic cross-sectional views.
Figure 3:
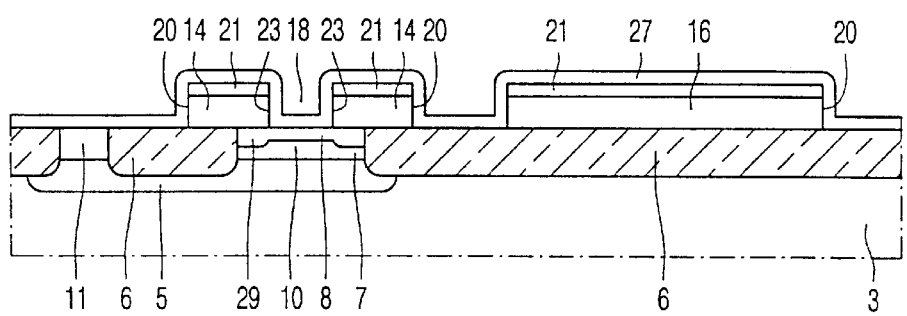

The conductors 14, 15, 16, 17 are provided at the top side 19 and the side faces 20 with a layer of an insulating material 21, 22, respectively. Also the window 18 is provided, on the wall 23, with a layer of an insulating material 24. For this purpose, after deposition of the first layer of polycrystalline silicon 13 on the surface 12 of the semiconductor body 1, a first layer of an insulating material 25 is deposited on this layer 13. In this example, said first layer of insulating material is a customary, approximately 300 nm thick layer of silicon oxide. Subsequently, a photoresist mask 26 as shown in FIG. 1 is provided, whereafter both the first pattern of conductors 14, 15, 16, 17 and the emitter window 18 are simultaneously etched in both layers 13 and 25. Subsequently, the side faces 20 of the conductors 14, 15, 16, 17 and the wall 23 of the emitter window 18 are simultaneously provided with a layer of an insulating material 22, 24 by depositing, as shown in FIG. 3, a second layer of an insulating material 27 and subsequently anisotropically etching this layer until parts thereof which extend parallel to the surface 12 are removed again. In this example, the layer of insulating material 27 is an approximately 100 nm thick layer of silicon nitride.

To improve the adhesion of the silicon nitride layer 27, additionally, a maximally 10 nm thick layer of silicon oxide (not shown) may be formed by thermal oxidation on the side faces 20 of the conductors 14, 15, 16, 17 and on the wall 23 of the window 18 prior to the deposition of said layer of silicon nitride 27. In this process, also a thin layer of silicon oxide is formed on the surface of the active region 7 and the connection region 11. At said locations, the silicon oxide must be etched away again after the formation of the layers 22 and 24.

After the structure shown in FIG. 4 has been formed, the base region 8 of the transistor 1 is formed, in a customary manner in the active region 7 of the semiconductor body 1, from an edge 28 of the base electrode 15 adjoining the emitter window 18, by implantation of ions through the emitter window 18 and by diffusion of a dopant. In this manner, the base region 8 is doped with approximately $10^{18}$ boron atoms per cc, while the portions 29 thereof, which are situated below the edge 29 as a result of diffusion, are doped with approximately $10^{20}$ boron atoms per cc.

Subsequently, a second layer of polycrystalline silicon is deposited, which is ntype doped with approximately $10^{20}$ arsenic atoms per cc. In this layer, a second pattern of conductors 30, 31, 32, 33 is formed comprising an emitter electrode 30, a conductor 31 connected thereto, a second capacitor electrode 32 and a conductor 33 connected thereto, and a connection electrode 34 which is connected to the connection region 11 and hence to the collector region 10 of the transistor. The emitter region 9 of the transistor 1 is formed in the base region 8 from the emitter electrode 30 by diffusion of a dopant. This region 9 is doped with approximately $3.10^{20}$ arsenic atoms per cc.

The example shows the manufacture of a semiconductor device comprising a single transistor 1 and a single capacitor 2; in practice, however, the method will be used to manufacture an integrated circuit comprising a plurality of these elements. The transistor 1 has a base region 8 and an emitter region 9 which are formed through the emitter window 18 which is formed in the base electrode 14. Said emitter window has a length, for example, of 2 μm and a width of 1 μm. Such transistors, also referred to as polyemitter transistors, can be embodied so as to be very small and can very suitably be used to process signals of very high frequency, such as mobile telephony signals. Since the capacitors are also formed on the surface of the semiconductor body, conductor tracks which connect capacitors to each other and to transistors are very short. As a result, the method can very suitably be used to manufacture integrated circuits for processing said high-frequency signals.

In the first example shown hereinabove as well as in the examples to be shown hereinafter, the first pattern of conductors 14, 15, 16, 17 and the emitter window 18 are simultaneously etched in the first layer of polycrystalline silicon 13. This requires only one photoresist mask 26.

The conductors 14, 15, 16, 17 and the emitter window 18 are simultaneously formed using only one photoresist mask 26 and, in addition, the conductors 14, 15, 16, 17 and the wall 23 of the emitter window 18 are simultaneously provided with an insulating layer 22, 24 in a simple manner. In all examples that will be shown, the first pattern of conductors 14, 15, 16, 17 is etched in the first layer of polycrystalline silicon 13 after this layer has been covered with the first layer of insulating material 25. As a result, after etching, the upper side 19 of the conductors 14, 15, 16, 17 is automatically provided with a layer of an insulating material 21. All examples that will be shown have in common that, after the formation of the first pattern of conductors 14, 15, 16, 17 and the emitter window 18 in the first layer of polycrystalline silicon, the second layer of insulating material 27 is deposited and subsequently anisotropically etched until parts thereof extending parallel to the surface have been removed again. Apart from the wall 23 of the emitter window 18, the side faces 20 of the conductors 14, 15, 16, 17 are thus automatically provided with a layer of an insulating material.

The first layer of insulating material 25, which is deposited on the first layer of polycrystalline silicon 13, can be etched away over a part of its thickness at the location of the first capacitor electrode 16 before the second capacitor electrode 31 is formed. In this manner, a capacitor 2 having a relatively thin dielectric is formed. To achieve this, it is necessary however to provide a photoresist mask on the first layer of insulating material 25. Preferably, as shown in FIGS. 5 and 6, a larger capacitance is realized by forming the second capacitor electrode 31 such that it covers both the upper side 19 and the side face 20 of the first capacitor electrode 16. As shown in the first example, the thickness of the layer applied to the side face 20 is, for example, approximately 100 nm, which is relatively thin. Since the second capacitor electrode 31 extends beyond the side face 19 of the first capacitor electrode, the side face 19 contributes to the size of the capacitance of the capacitor. This enables a capacitor having a larger capacitance to be formed, without the use of an additional photoresist mask, and without taking up more space on the surface of the semiconductor body. A capacitor having a length and a width of 100 μm with a subelectrode 16 which is covered at its upper side 19 with a 300 nm thick layer of silicon oxide is increased by approximately 10% by the contribution of the side faces having a height of 1 μm, which are covered with a 100 nm thick layer of silicon nitride.

Figure 7:
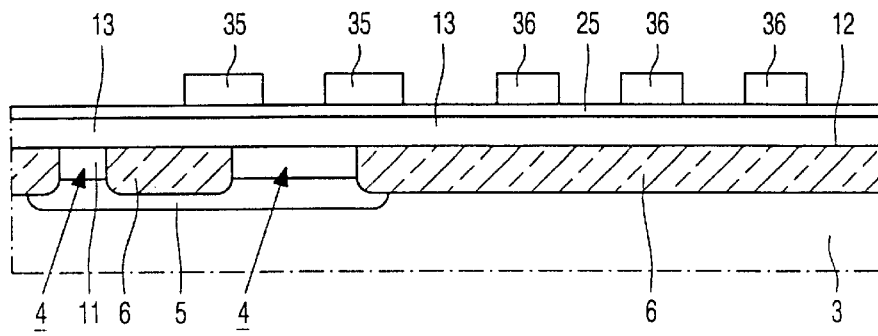
FIGS. 7 through 11 are diagrammatic cross-sectional views of several stages in the manufacture of a semiconductor device, using a second embodiment of the method in accordance with the invention.

FIGS. 7 through 11 are cross-sectional views of a few stages of a second example of the manufacture of a semiconductor device comprising a bipolar transistor 1 and a capacitor 2. In this method, a capacitor 2 is obtained having a capacitance which is larger than that in the first embodiment of the method. FIG. 7 shows a stage in the manufacturing process which practically corresponds to that shown in FIG. 1. Also in this case, the surface 12 is provided with the first layer of polycrystalline silicon 13 and with the layer of insulating material 25. Subsequently, a photoresist mask 35, 36 is formed thereon. Apart from a pattern 35 for the formation of the base electrode 14, the emitter window 18 and the conductors 15 and 17, the photoresist mask comprises a pattern with strips 36 for the formation of the first capacitor electrode 16. The first pattern of conductors 14, 15, 17 and a first capacitor electrode 37, 38 are simultaneously formed, said capacitor electrode consisting of a number of parallel strips 37 which are mutually connected by an intermediate part 38. The side faces 39 of all strips 37 are automatically covered with the second insulating layer 21 which, as indicated hereinabove, may be very thin. The capacitance of the capacitor being formed is predominantly determined by contributions from the side faces of the strips. This enables a capacitor to be formed, on a surface having the same dimensions, whose capacitance is much larger than that of a capacitor without strips.

Figure 8:
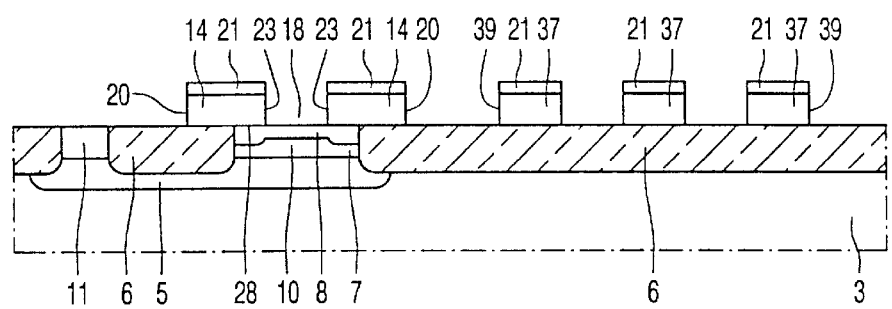
Figure 9:
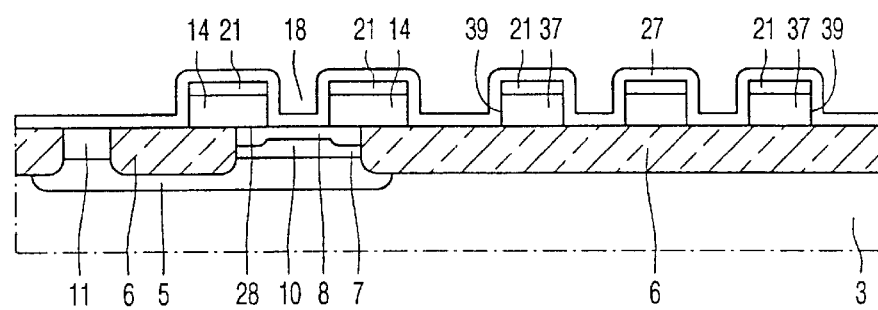
Figure 10:
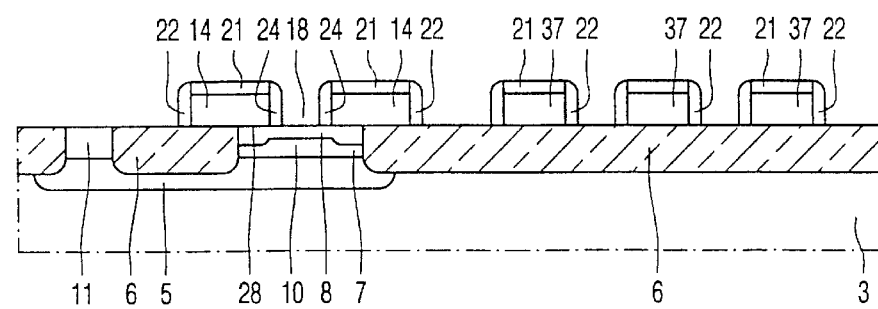
Figure 11:
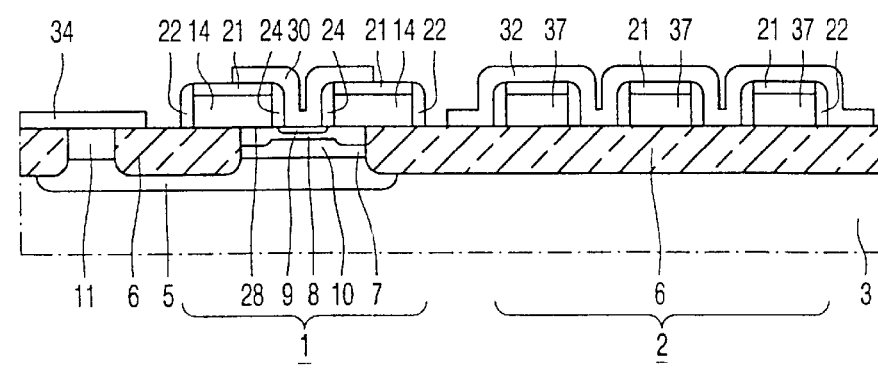

After the formation of the first pattern of conductors 14, 15, 17, 37, 38, the structure as shown in FIG. 8 is provided, as in the first example, with an insulating layer 27 which, also in this case, is an approximately 100 nm thick layer of silicon nitride. This layer is again subjected to anisotropic etching until parts thereof extending parallel to the surface 12 have been etched away, the layers 22 on the side faces of the conductors 14, 15, 17, 36, 37 and the layers 24 on the walls 23 of the emitter window 18 remaining intact. Finally, also in this example, the emitter electrode 30 and the second capacitor electrode 32 are formed in a second layer of polycrystalline silicon. The second capacitor electrode 32 follows the surface of the strips 37.

A capacitor thus formed, comprising 1 μm wide strips 37 situated at intervals of 1 μm, which strips are covered at the upper side with 300 nm silicon oxide and at the side faces with 100 nm silicon nitride, has a capacitance which is approximately four times that of a capacitor taking up an equal surface area and comprising an undivided first capacitor electrode covered with an equally thick (300 nm) layer of silicon oxide.

Figure 17:
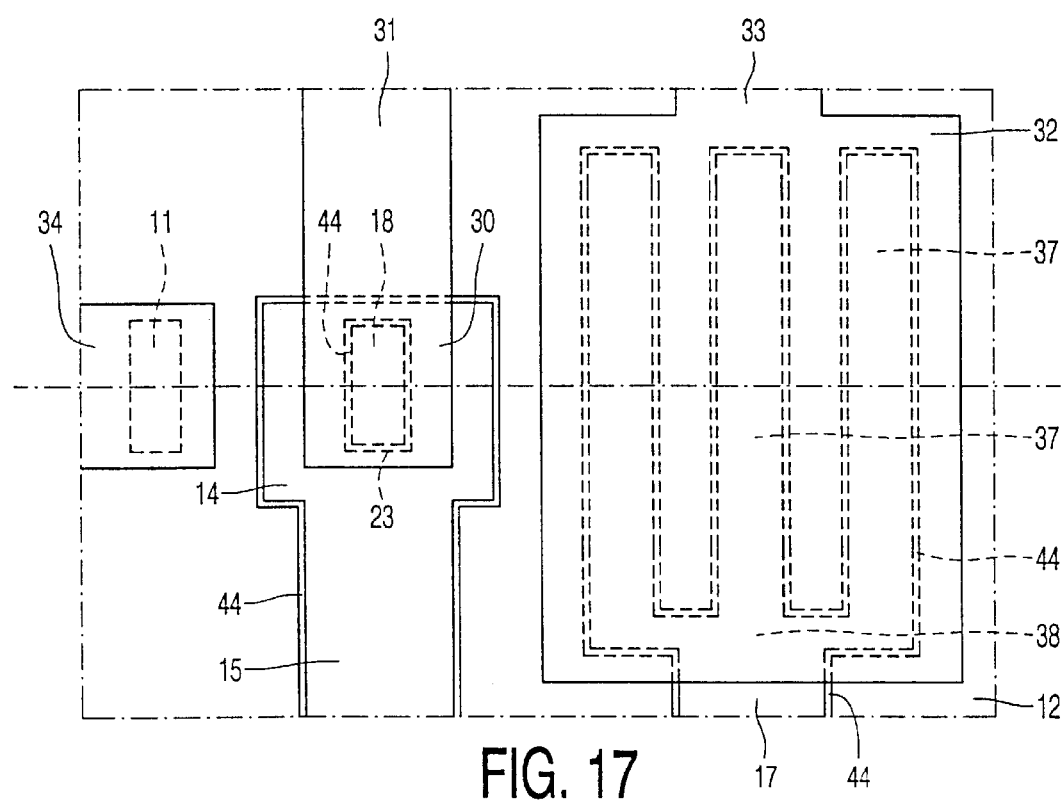
FIG. 17 is a diagrammatic plan view, of several stages in the manufacture of a semiconductor device, using a third embodiment of the method in accordance with the invention.
Figure 12:
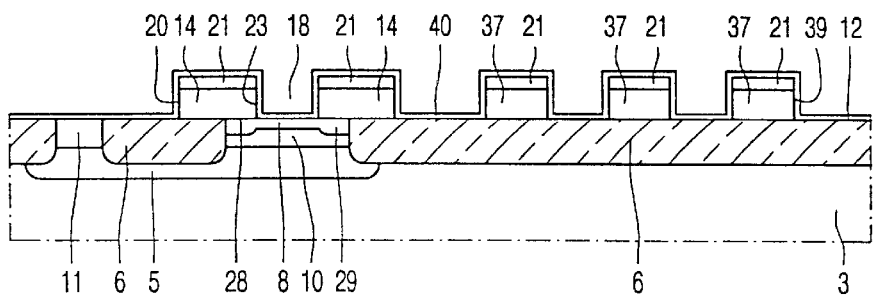
FIGS. 12 through 16 are diagrammatic cross-sectional views.
Figure 13:
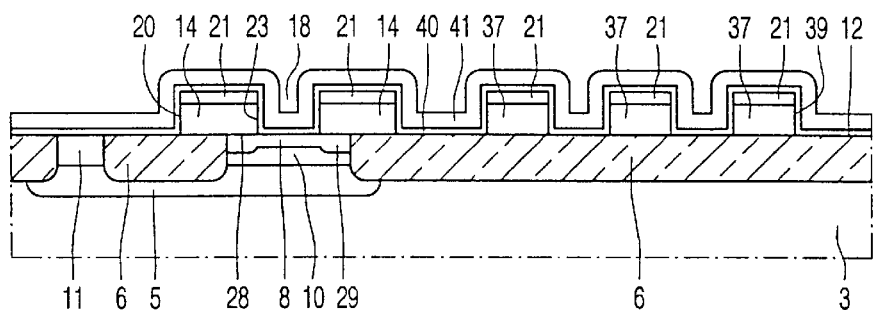
Figure 14:
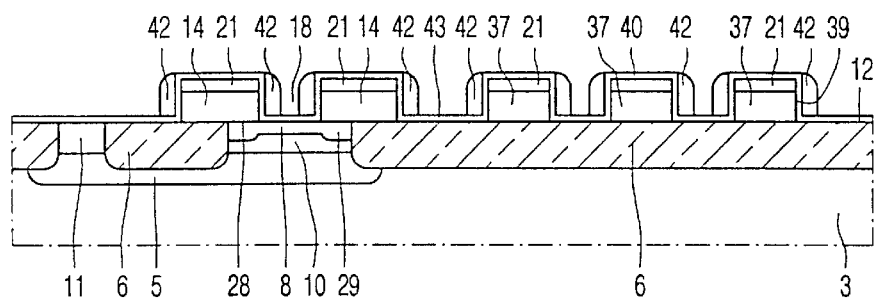

The cross-sectional views shown in FIGS. 12 through 16, and the plan view shown in FIG. 17 depict a few stages of a third example of the manufacture of a semiconductor device comprising a bipolar transistor 1 and a capacitor 2. In this method, a capacitor 2 having an even larger capacitance is obtained. FIG. 12 shows a stage in the manufacturing process which substantially corresponds to that shown in FIG. 8. In this embodiment of the method, following the deposition of a second layer of an insulating material 40, a third layer of an insulating material 41 is deposited to cover the wall 23 of the emitter window 18 and the side faces 20, 39 of the conductors 14, 15, 17, 36, 37. In this example, the second layer 40 is an approximately 40 nm thick layer of silicon nitride, and the third layer 41 is an approximately 200 nm thick layer of polycrystalline silicon.

Figure 15:
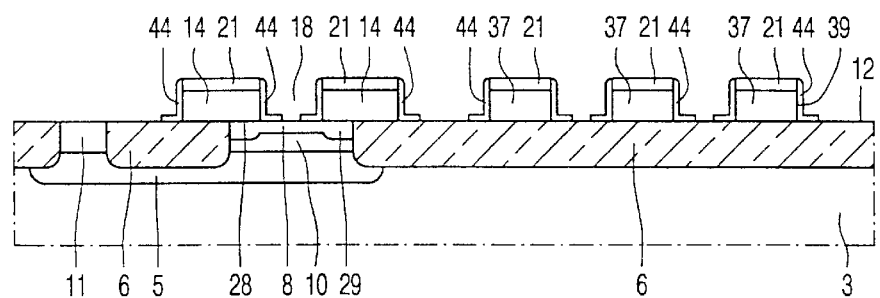
Figure 16:
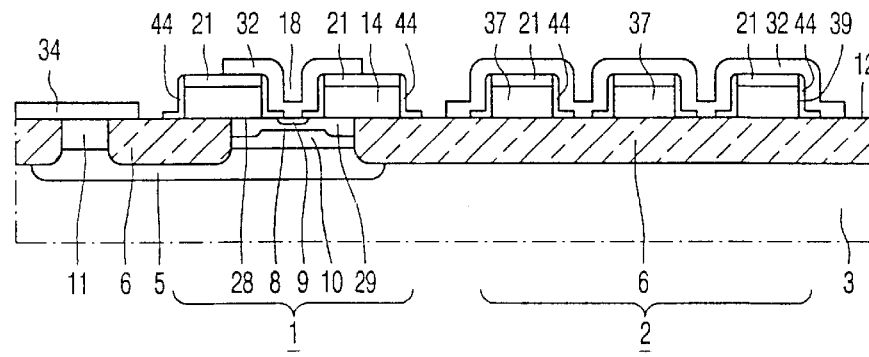
Figure 18:
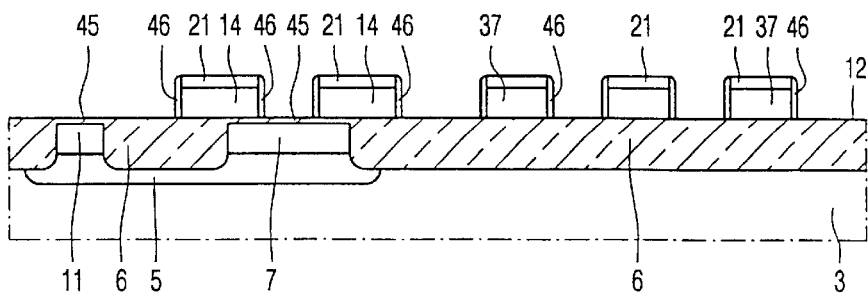
FIG. 18 through FIG. 22 are diagrammatic cross-sectional views of several stages in the manufacture of a semiconductor device, using a fourth embodiment of the method in accordance with the invention.
Figure 19:
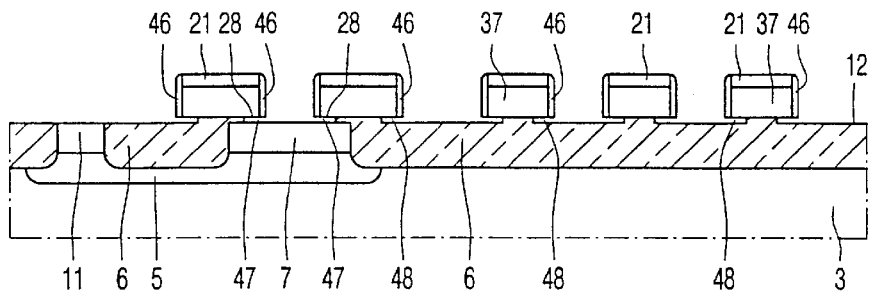
Figure 20:
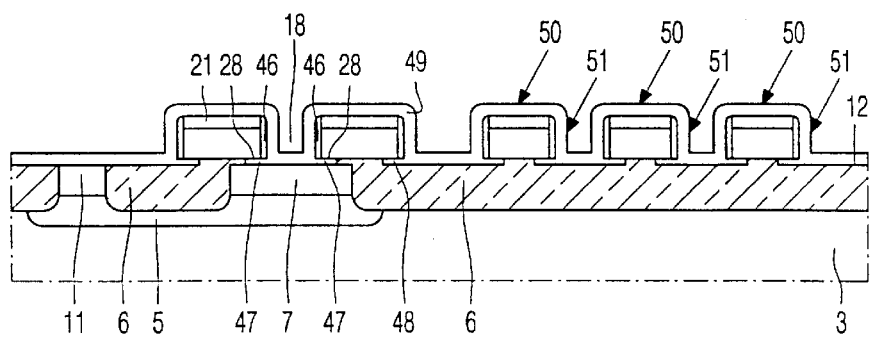

The third layer 41 is anisotropically etched until parts thereof extending parallel to the surface 12 have been removed again, the parts 42 of the layer 41 remaining intact. Subsequently, as shown in FIG. 15, uncovered parts 43 of the second layer 40 and, finally, remaining parts 42 of the third layer 41 are successively removed. The L-shaped parts 44 of the second layer 40 remain on the side faces 20 and 39 of the window and on the wall 23 of the window. These L-shaped parts 44 serve to preclude a short-circuit between the emitter region 9 and the base electrode 14 during the formation of said emitter region 9. As these L-shaped parts 44 extend over a part of the surface, they can be embodied so as to be extremely thin, in the example only 40 nm. As a result, the contributions from the side faces 39 of the first capacitor electrode 37 are relatively great. At the same dimensions of a capacitor 2, as shown in the second example, the capacitance of the capacitor 2 can be increased by a factor of 2.

In this case, just like in the first example, prior to the deposition of the layers 40 and 41, first an approximately 10 nm thick layer of silicon oxide may be thermally formed on the side faces 20 of the conductors, and on the wall 23 of the emitter window 18, said layer also being formed on the surface of the active region and the connection region, where it is removed again after the formation of the parts 44.

Figure 21:
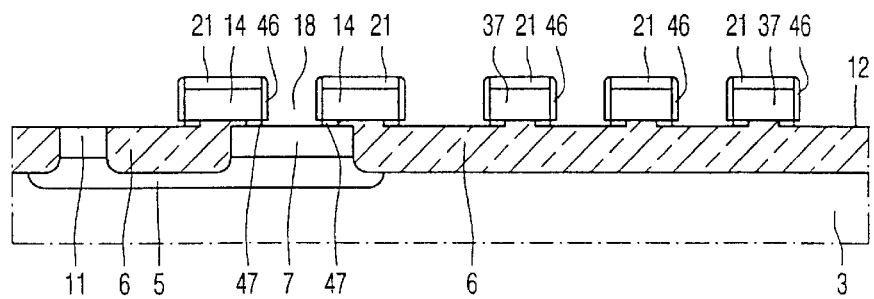
Figure 22:
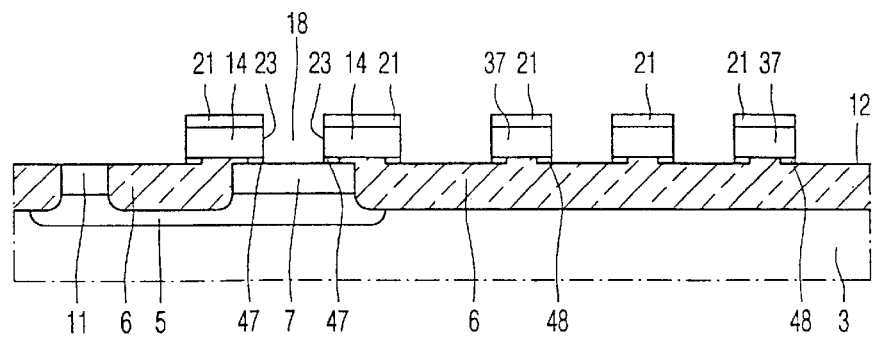

Finally, FIGS. 18 through 22 show in cross-section a few stages of a fourth example of the manufacture of a semiconductor device comprising a bipolar transistor 1 and a capacitor 2. This method is substantially equal to that shown in the second and the third example, with the exception of the first conductors which are formed differently. Prior to the deposition of the first layer of polycrystalline silicon 13 on the surface 12, in which layer of polycrystalline silicon the conductors 14, 15, 17, 37, 38 and the emitter window 18 are formed, the active region 7 and the connection region 11 are provided with an approximately 30 nm thick layer of silicon oxide 45 by thermally oxidizing the silicon in these regions 7, 11 which borders on the surface. After the formation of the conductors 14, 15, 17, 37, 38 and the emitter window 18, a thin layer of silicon nitride is deposited which is subsequently subjected to an anisotropic etching treatment until parts thereof extending parallel to the surface 12 have been removed again. The parts 46 of this unshown layer remain. Subsequently, an isotropic, for example, wet etching treatment is carried out wherein silicon oxide is etched away from the active region 7 and the connection region. This etching treatment is continued until the layer of silicon oxide 45 has also been removed below the edge 28 of the base electrode 14 adjoining the window 18. In this process, cavities are formed below the edge 28. In addition, in this process cavities are also formed below edges of the conductors 14, 15, 17, 37, 38 situated on field oxide. All cavities 47, 48 are subsequently filled with polycrystalline silicon by depositing a layer 49 of said material and by subsequently carrying out an etching operation, using an isotropic, for example, wet etching treatment, until parts 50 and 51 thereof extending, respectively, parallel and transversely to the surface have been removed again. As shown in FIG. 21, in this process polycrystalline silicon remains in the cavities 47.

The parts 46 formed on the side faces of the conductors 14, 15, 16, 17, 37, 38 and on the wall 23 of the emitter window 18 are removed. In this manner, it is achieved that in the formation of the capacitor 2, the layer 22, 44 which is formed on the side face 20, 39 of the first capacitor electrode 16, 37 by the parts 46 is not needlessly increased in thickness.

Figure 2:
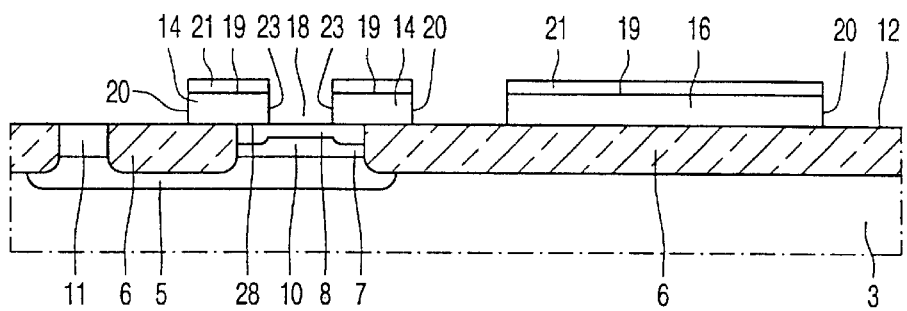

The stage which is reached after the removal of the parts 46 of the layer of silicon nitride (not shown) is substantially equal to that shown in FIGS. 2 and 8. For the rest, the method is equal to that used in the above-described examples. Using the fourth embodiment of the method, it is achieved that during the formation of the emitter window 18 in the base electrode 14, etching of silicon in the active region 7 is limited as much as possible. In the other methods described herein, the emitter window 18 is etched in the layer of polycrystalline silicon 13 which is directly deposited on the active region 7. During this etching process, also the field oxide 6 is locally exposed. During etching, it is possible to detect the transition from etching polycrystalline silicon to etching silicon oxide. The etching process is continued for a short period of time, to be determined in practice, to make sure that the active region 7 within the emitter window 18 is exposed. In practice, this "over-etching time" leads to an approximately 50 nm deep pit (not shown) in the active region. The base region 8 is subsequently formed in this pit. The pn-junction between the base region 8 and the collector region 10 is consequently formed at a greater depth in the active region. This does not have to pose a problem. However, a problem will arise if, viewed over the surface of the slice, this depth exhibits differences, because, in practice, the etching process, viewed over the slice, is generally not completely homogeneous. As a result, the transistors formed are no longer identical, which may cause problems in an integrated circuit. These problems are avoided in the method in accordance with the fourth example. In this case, etching of the emitter window stops on the layer of silicon oxide 45 which is present on the active region. When the polycrystalline silicon layer 49 deposited at a later stage is etched away, a pit having a much smaller depth is formed in the active region because this layer 49 is very thin. The layer 13 has a thickness of approximately 500 nm, the layer 49 has a thickness of approximately 20 nm. An over-etching time which is the same percentage-wise would cause a pit having a depth of approximately 2 nm in the active region.

What is claimed is:

1. A method of manufacturing a semiconductor device comprising a bipolar transistor and a capacitor having only two capacitor electrodes, wherein a first layer of polycrystalline silicon is deposited on a surface of a semiconductor body, in which first layer of polycrystalline silicon there is formed a first pattern of conductors with a base electrode and a first capacitor electrode, and in which also an emitter window is etched, which is situated within the base electrode, wherein the base region of the transistor in the semiconductor body is formed from an edge of the base electrode adjoining the emitter window, by implantation of ions through the emitter window and by diffusion of a dopant, a second layer of polycrystalline silicon is deposited wherein a second pattern of conductors is formed with an emitter electrode and a second capacitor electrode, and the emitter region of the transistor in the base region is formed from the emitter electrode by diffusion of a dopant, characterized in that after deposition of the first layer of polycrystalline silicon on the surface of the semiconductor body, a first layer of an insulating material is deposited on this layer, whereafter both the first pattern of conductors and the emitter window are simultaneously etched in both layers, after which the side faces of the conductors and the wall of the emitter window are simultaneously provided with a layer of an insulating material by depositing a second layer of an insulating material and anisotropically etching this layer until parts thereof extending parallel to the surface have been removed and discontinuing said anisotropically etching prior to any conductive layers beneath the second layer of insulating material being etched.

2. A method as claimed in claim 1, characterized in that the second capacitor electrode is formed in such a manner that it covers both the upper side of the first capacitor electrode and the side face of the first capacitor electrode which is directed transversely to the surface.

3. A method as claimed in claim 2, characterized in that in the formation of the first pattern of conductors, a first capacitor electrode is formed which is composed of a number of mutually connected strips extending parallel to each other.

4. A method as claimed in claim 1, characterized in that, to cover the wall of the emitter window and the side faces of the conductors, a third layer of insulating material is deposited after the deposition of the second layer of insulating material, whereafter the third layer is anisotropically etched until parts thereof extending parallel to the surface have been removed, whereafter uncovered parts of the second layer and, finally, remaining parts of the third layer are successively removed.

5. A method as claimed in claim 1, characterized in that prior to the deposition of the first layer of polycrystalline silicon on the surface, a thin layer of silicon oxide is formed on the active region, which thin layer, after the formation of the emitter window in the first layer of polycrystalline silicon, is removed within the emitter window and below an edge of the base electrode bordering on the emitter window, a cavity being formed in this process which is filled with the second layer of polycrystalline material.

6. A method as claimed in claim 5, characterized in that the cavity formed below the edge of the base electrode bordering on the emitter window is filled with polycrystalline silicon by depositing a layer of polycrystalline silicon and by isotropically etching this layer until parts thereof extending parallel and transversely to the surface are removed.

7. A method as claimed in claim 5, characterized in that before the cavity formed below the edge of the base electrode bordering on the emitter window is filled with the second layer of polycrystalline material, the wall of the emitter window is covered with the second layer of insulating material comprising a layer of silicon nitride, which layer is removed after the cavity has been filled.

* * * * *